(12) United States Patent
Tsuda

(10) Patent No.: US 9,166,556 B2
(45) Date of Patent: Oct. 20, 2015

(54) ELASTIC WAVE DEVICE

(71) Applicant: Murata Manufacturing Co., Ltd., Nagaokakyo-shi, Kyoto-ku (JP)

(72) Inventor: Motoji Tsuda, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 18 days.

(21) Appl. No.: 14/339,578

(22) Filed: Jul. 24, 2014

(65) Prior Publication Data
US 2014/0333391 A1    Nov. 13, 2014

Related U.S. Application Data

(63) Continuation of application No. PCT/JP2013/050170, filed on Jan. 9, 2013.

(30) Foreign Application Priority Data

Jan. 30, 2012 (JP) .................................. 2012-016774

(51) Int. Cl.
| | |
|---|---|
| *H03H 9/54* | (2006.01) |
| *H03H 9/05* | (2006.01) |
| *H03H 9/25* | (2006.01) |
| H03H 9/08 | (2006.01) |
| H03H 9/64 | (2006.01) |

(Continued)

(52) U.S. Cl.
CPC .............. *H03H 9/542* (2013.01); *H03H 9/0557* (2013.01); *H03H 9/25* (2013.01); *H03H 9/08* (2013.01); *H03H 9/64* (2013.01); *H03H 9/6483* (2013.01); *H03H 9/706* (2013.01); *H03H 9/725* (2013.01)

(58) Field of Classification Search
CPC ..... H03H 9/6483; H03H 9/725; H03H 9/542; H03H 9/0057; H03H 9/08; H03H 9/25; H03H 9/64; H03H 9/706
USPC ......... 333/133, 187, 189, 193, 194, 195, 196; 310/313 B, 313 D, 340, 346
See application file for complete search history.

(56) References Cited

U.S. PATENT DOCUMENTS 8,004,370 B2 * 8/2011 Yamagata ..................... 333/133
2002/0000895 A1    1/2002 Takahashi et al.

(Continued)

FOREIGN PATENT DOCUMENTS

| JP | 9-98046 A | 4/1997 |
|---|---|---|
| JP | 11-26623 A | 1/1999 |

(Continued)

OTHER PUBLICATIONS

Official Communication issued in corresponding International Application PCT/JP2013/050170, mailed on Mar. 5, 2013.

*Primary Examiner* — Benny Lee
*Assistant Examiner* — Jorge Salazar, Jr.
(74) *Attorney, Agent, or Firm* — Keating & Bennett, LLP

(57) ABSTRACT

An elastic wave device includes a resonator and an inductor. One end of the inductor is connected to the resonator, and the other end of the inductor is connected to a ground electrode or a signal electrode. The elastic wave device includes a chip and a mounting substrate. The chip includes a piezoelectric substrate and an interdigital transducer electrode provided on the piezoelectric substrate so define the resonator. The chip is mounted on the mounting substrate. The inductor is provided to the mounting substrate. A dummy electrode to which the one end side of the inductor is connected and the ground electrode or the signal electrode are provided on a surface of the mounting substrate that is opposite to the chip.

14 Claims, 5 Drawing Sheets

(51) Int. Cl.
  *H03H 9/70* (2006.01)
  *H03H 9/72* (2006.01)

(56) References Cited

U.S. PATENT DOCUMENTS

2009/0096551 A1  4/2009  Yamagata
2010/0091473 A1  4/2010  Kiwitt et al.

FOREIGN PATENT DOCUMENTS

| | | |
|---|---|---|
| JP | 2003-8186 A | 1/2003 |
| JP | 2010-526456 A | 7/2010 |
| JP | 2010-171680 A | 8/2010 |
| WO | 2007/114390 A1 | 10/2007 |
| WO | 2008/029641 A1 | 3/2008 |

* cited by examiner

ELASTIC WAVE DEVICE

BACKGROUND OF THE INVENTION

1. Field of the Invention

The present invention relates to an elastic wave device.

2. Description of the Related Art

Elastic wave devices have been widely used as filters and resonators. An elastic wave device generates heat when applying current. Thus, in the case where the heat radiation property of the elastic wave device is low, the temperature of the elastic wave device rises, and there is a concern that an operation abnormality or breakage of the elastic wave device occurs.

As a method for improving the heat radiation property of an electronic component, a method is known in which a via-hole conductor for heat radiation is provided to a mounting substrate, for example, as described in Japanese Unexamined Patent Application Publication No. 2003-8186.

Some elastic wave devices include an inductor. The inductor is generally provided in/on a mounting substrate. In such an elastic wave device including an inductor provided in/on a mounting substrate, it may be difficult to sufficiently improve the heat radiation property of the elastic wave device when a via-hole conductor for heat radiation is merely provided. This is because heat generated in a resonator connected to the inductance is transmitted through the inductor having a long drawn length and then is radiated via the via-hole conductor, whereby a heat radiation path is made long.

SUMMARY OF THE INVENTION

Preferred embodiments of the present invention improve the heat radiation property of an elastic wave device including an inductor that is provided in or on a mounting substrate and connected at one end thereof to a resonator.

An elastic wave device according to a preferred embodiment of the present invention includes a resonator and an inductor. One end of the inductor is connected to the resonator, and another end of the inductor is connected to a ground electrode or a signal electrode. The elastic wave device according to a preferred embodiment of the present invention includes a chip and a mounting substrate. The chip includes a piezoelectric substrate and an interdigital transducer electrode. The interdigital transducer electrode is provided on the piezoelectric substrate. The interdigital transducer electrode defines the resonator. The chip is mounted on the mounting substrate. The inductor is provided to the mounting substrate. A dummy electrode to which the one end side of the inductor is connected and the ground electrode or the signal electrode are provided on a surface of the mounting substrate that is opposite to the chip.

The inductor preferably is provided within the mounting substrate.

The inductor and the dummy electrode preferably are connected to each other through a via hole electrode. The inductor and the ground electrode or the signal electrode preferably are connected to each other through a via hole electrode.

The mounting substrate preferably includes a substrate main body and a resin layer provided on the substrate main body. The inductor preferably is provided between the substrate main body and the resin layer.

The resonator preferably defines a parallel arm resonator of a ladder filter.

According to various preferred embodiments of the present invention, it is possible to improve the heat radiation property of an elastic wave device including an inductor that is provided in or on a mounting substrate and connected at one end thereof to a resonator.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
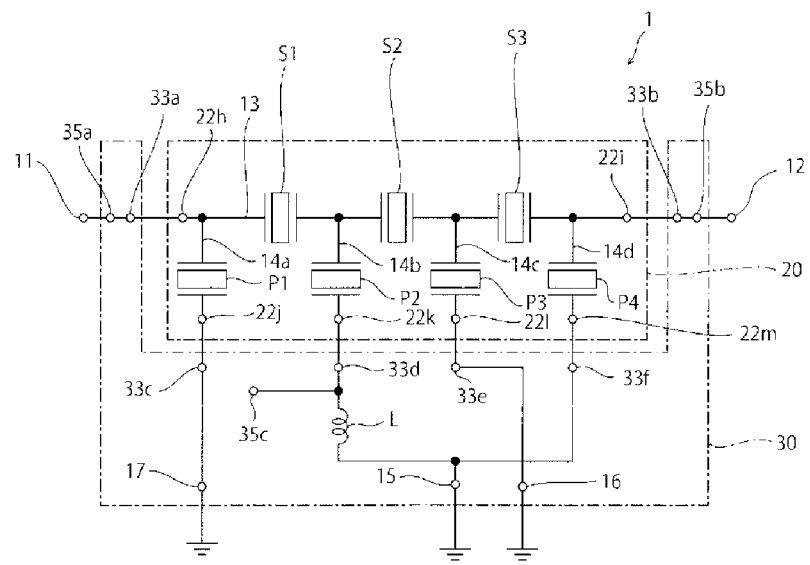
FIG. 1 is a schematic circuit diagram of an elastic wave device according to a first preferred embodiment of the present invention.

Hereinafter, example of preferred embodiments of the present invention will be described. It should be noted that the following preferred embodiments are merely illustrative. The present invention is not limited to the following preferred embodiments in any manner.

In addition, in each drawing to which reference is made in preferred embodiments and the like, components having substantially the same functions are designated by the same reference characters. Moreover, the drawings to which reference is made in the preferred embodiments and the like are schematically illustrated, and the ratio of the dimensions or the like of objects drawn in the drawings is different from the ratio of the dimensions or the like of the actual objects in some cases. The dimension ratio or the like of the objects is different between the drawings in some cases. The specific dimension ratio or the like of the objects should be determined in consideration of the following description.

First Preferred Embodiment

FIG. 1 is a schematic circuit diagram of an elastic wave device according to the present preferred embodiment. First, the circuit configuration of the elastic wave device 1 will be described with reference to FIG. 1.

The elastic wave device 1 preferably is an elastic wave filter device using surface acoustic waves, boundary acoustic waves, or bulk acoustic waves. It should be noted that the present invention is not limited to this configuration. An elastic wave device according to other preferred embodiments of the present invention may be an elastic wave device other than an elastic wave filter device, such as an elastic wave resonator. In addition, the elastic wave device according to other preferred embodiments of the present invention may be, for example, an elastic wave demultiplexer such as a duplexer or a triplexer having a plurality of filter portions.

The elastic wave device 1 includes at least one of resonators S1 to S3 and P1 to P4 and an inductor L connected at one end thereof to at least one of the resonators S1 to S3 and P1 to P4 and at the other end thereof to a ground electrode or a signal electrode.

Specifically, the elastic wave device 1 includes a first signal terminal 11 and a second signal terminal 12. In the case where the elastic wave device 1 is a transmitting device, the first signal terminal 11 defines an antenna terminal, and the second signal terminal 12 defines an input signal terminal. A plurality of series arm resonators S1 to S3 are connected in series between the first signal terminal 11 and the second signal terminal 12. These series arm resonators S1 to S3 define a series arm 13.

A plurality of parallel arms 14a to 14d are connected between the series arm 13 and ground electrodes. Parallel arm resonators P1 to P4 are provided in the plurality of parallel arms 14a to 14d, respectively. The parallel arm 14a is connected to a ground electrode 17 connected to a ground potential. The parallel arm 14b and the parallel arm 14d are connected in common to a ground electrode 15 connected to the ground potential. The parallel arm 14c is connected to a ground electrode 16 connected to the ground potential.

In the parallel arm 14b, the inductor L is connected in series to the parallel arm resonator P2. One end of the inductor L is connected to the parallel arm resonator P2, and the other end of the inductor L is connected to the ground electrode 15. In other words, the resonator to which the one end of the inductor L is connected defines a parallel arm resonator of a ladder filter.

Figure 2:
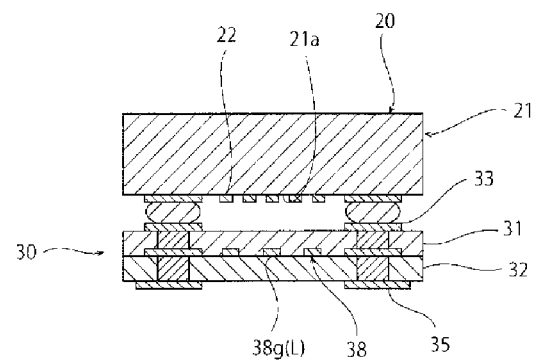
FIG. 2 is a schematic cross-sectional view of the elastic wave device according to the first preferred embodiment of the present invention.
Figure 3:
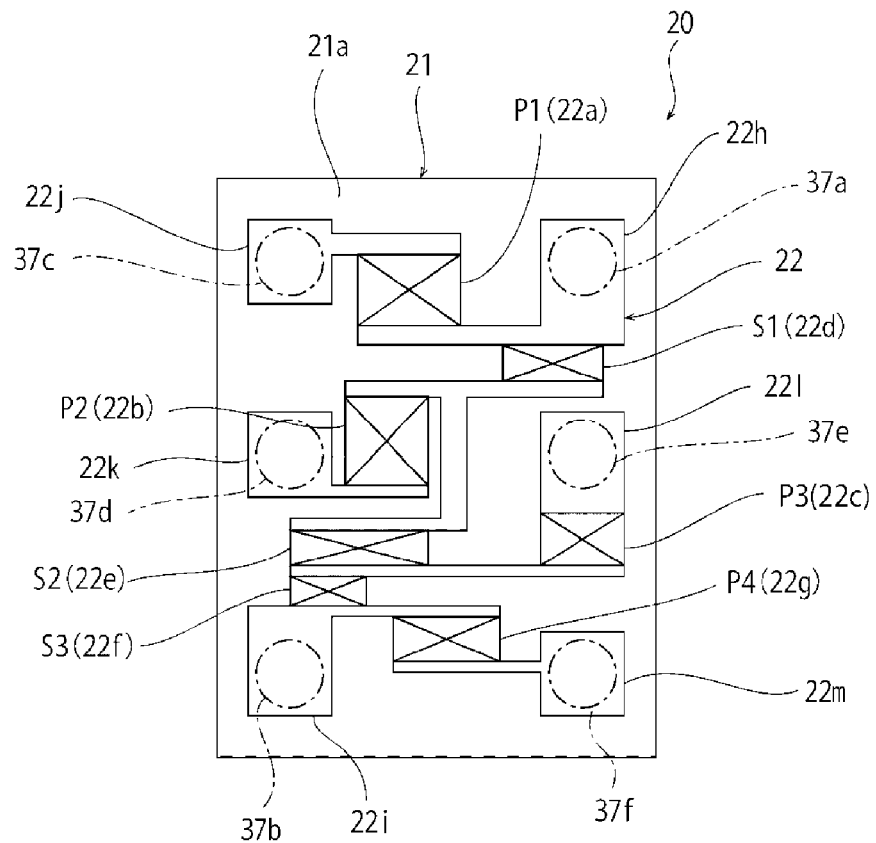
FIG. 3 is a schematic perspective back view of an elastic wave chip in the first preferred embodiment of the present invention.
Figure 4:
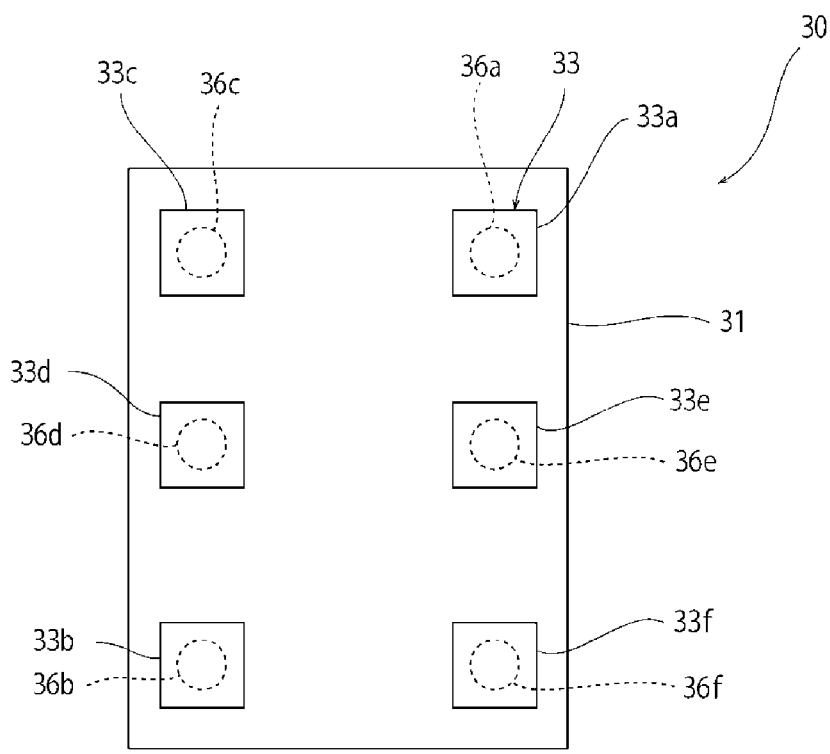
FIG. 4 is a schematic plan view of a die-attach surface of a mounting substrate in the first preferred embodiment of the present invention.
Figure 5:
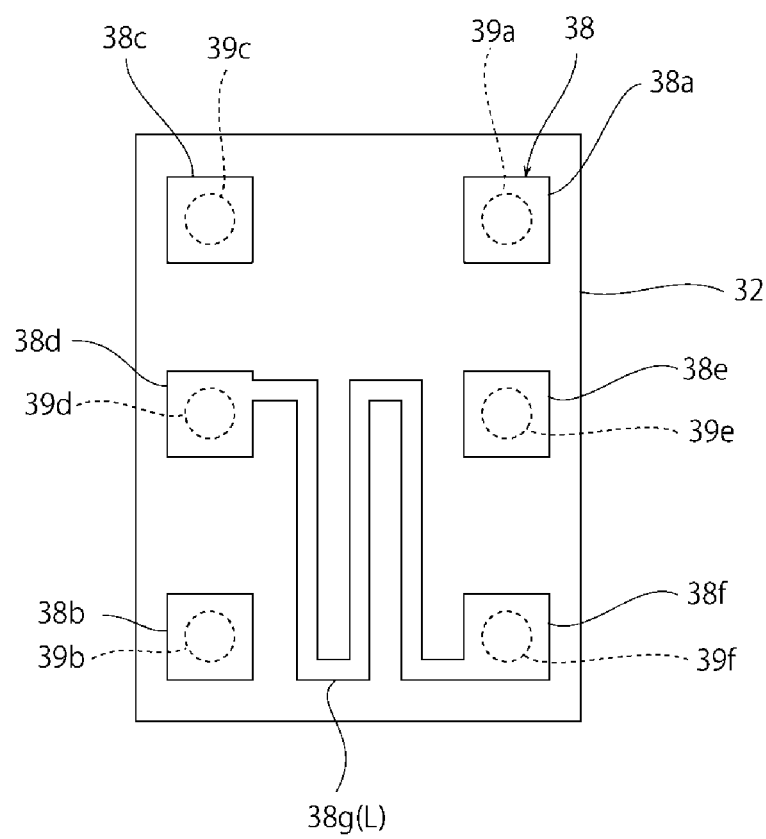
FIG. 5 is a schematic plan view of an intermediate electrode layer in the first preferred embodiment of the present invention.
Figure 6:
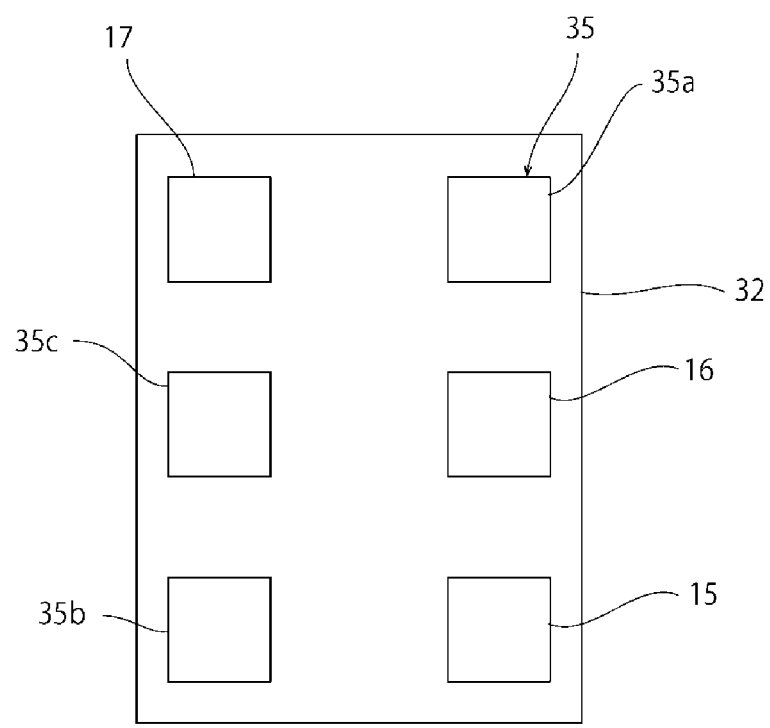
FIG. 6 is a schematic perspective back view of the mounting substrate in the first preferred embodiment of the present invention.

FIG. 2 is a schematic cross-sectional view of the elastic wave device according to the first preferred embodiment. FIG. 3 is a schematic perspective back view of an elastic wave chip in the first preferred embodiment. FIG. 4 is a schematic plan view of a die-attach surface of a mounting substrate in the first preferred embodiment. FIG. 5 is a schematic plan view of an intermediate electrode layer in the first preferred embodiment. FIG. 6 is a schematic perspective back view of the mounting substrate in the first preferred embodiment.

Next, the specific configuration of the elastic wave device 1 will be described mainly with reference to FIGS. 2 to 6.

The elastic wave device 1 includes an elastic wave chip 20 and a mounting substrate 30.

The elastic wave chip 20 includes a piezoelectric substrate 21 and an electrode 22. The piezoelectric substrate 21 may be formed from, for example, $LiNbO_3$, $LiTaO_3$, or the like. It should be noted that for the purpose of adjusting an electromechanical coupling coefficient or the like, the piezoelectric substrate includes a piezoelectric substrate having a layer configured to adjust an electromechanical coupling coefficient, such as a dielectric layer, provided on its surface.

The electrode 22 is provided on a principal surface 21a, at the mounting substrate 30 side, of the piezoelectric substrate 21. The electrode 22 includes interdigital transducer electrodes 22a to 22g defining the resonators S1 to S3 and P1 to P4. Each of the interdigital transducer electrodes 22a to 22g includes a pair of comb electrodes interdigitated with each other.

The electrode 22 further includes pad electrodes 22h to 22m. As shown in FIG. 1, the pad electrode 22h is connected to the first signal terminal 11. The pad electrode 22i is connected to the second signal terminal 12. The pad electrode 22j is connected to the first parallel arm resonator P1. The pad electrode 22k is connected to the second parallel arm resonator P2. The pad electrode 22l is connected to the third parallel arm resonator P3. The pad electrode 22m is connected to the fourth parallel arm resonator P4.

The elastic wave chip 20 is mounted on the mounting substrate 30. The mounting substrate 30 includes stacked first and second dielectric layers 31 and 32. A first electrode layer is provided on the first dielectric layer 31. A second electrode layer 38 is provided between the first dielectric layer 31 and the second dielectric layer 32. A third electrode layer 35 is provided on the second dielectric layer 32.

As shown in FIG. 4, the first electrode layer 33 includes pad electrodes 33a to 33f. As shown in FIG. 1, the pad electrode 33a is connected to the pad electrode 22h via a bump 37a. The pad electrode 33b is connected to the pad electrode 22i via a bump 37b. The pad electrode 33c is connected to the pad electrode 22j via a bump 37c. The pad electrode 33d is connected to the pad electrode 22k via a bump 37d. The pad electrode 33e is connected to the pad electrode 22l via a bump 37e. The pad electrode 33f is connected to the pad electrode 22m via a bump 37f.

As shown in FIG. 5, the second electrode layer 38 includes electrodes 38a to 38g. The electrode 38a is connected to the pad electrode 33a through a via hole electrode 36a. The electrode 38b is connected to the pad electrode 33b through a via hole electrode 36b. The electrode 38c is connected to the pad electrode 33c through a via hole electrode 36c. The electrode 38d is connected to the pad electrode 33d through a via hole electrode 36d. The electrode 38e is connected to the pad electrode 33e through a via hole electrode 36e. The electrode 38f is connected to the pad electrode 33f through a via hole electrode 36f. The electrode 38d and the electrode 38f are connected to each other via a drawing electrode 38g. The drawing electrode 38g defines the inductor L. Thus, the inductor L is provided to the mounting substrate 30.

As shown in FIG. 6, the third electrode layer 35 includes the ground electrodes 15, 16, and 17, signal electrodes 35a and 35b, and a dummy electrode 35c.

The ground electrode 15 is connected to the electrode 38f through a via hole electrode 39f. The ground electrode 16 is connected to the electrode 38e through a via hole electrode 39e. The ground electrode 17 is connected to the electrode 38c through a via hole electrode 39c. The signal electrode 35a is connected to the electrode 38a through a via hole electrode 39a. The signal electrode 35b is connected to the electrode 38b through a via hole electrode 39b.

The dummy electrode 35c is connected to the electrode 38d through a via hole electrode 39d. Thus, also as shown in FIG. 1, the dummy electrode 35c to which the one end side of the inductor L is connected and the ground electrode 15 to which the other end side of the inductor L is connected are provided on a surface (back surface) of the mounting substrate 30 that is opposite to the elastic wave chip 20. The inductor L is provided within the mounting substrate 30, and the inductor L is connected to the dummy electrode 35c and the ground electrode 15 through the via hole electrodes 39d and 39f, respectively.

For example, in the case where the dummy electrode 35c is not provided, heat in the parallel arm resonator P2 is substantially radiated only via the drawing electrode 38g forming the inductor L. Here, the drawing electrode 38g is an electrode having a long drawn length. In particular, in order to obtain a high inductance value, it is necessary to lengthen the drawing electrode 38g. Therefore, a heat radiation path for the parallel arm resonator P2 is lengthened. As a result, heat in the parallel arm resonator P2 is less likely to be radiated, and the temperature of the elastic wave device 1 is likely to rise.

In contrast, in the present preferred embodiment, the dummy electrode 35c is provided. Thus, as a heat radiation path for the parallel arm resonator P2, a path that goes to the dummy electrode 35c without going via the drawing electrode 38g is present in addition to a path that goes via the drawing electrode 38g. The path is short since the path does not go through the drawing electrode 38g having a long drawn length. Thus, the heat radiation efficiency is high. Therefore, heat in the parallel arm resonator P2 is efficiently radiated, and temperature rise of the elastic wave device 1 is significantly reduced or prevented.

It should be noted that from the standpoint of improving a heat radiation property, it is also conceivable to provide an inductor on a die-attach surface of the mounting substrate. However, in this case, the flatness of the die-attach surface is decreased, and thus a harmful effect such as making it difficult to mount a chip thereon may arise. In contrast, in the elastic wave device 1, the flatness of the surface, at the elastic wave chip 20 side, of the mounting substrate 30 is less likely to be decreased. Therefore, the mountability of the elastic wave chip 20 is favorable.

Hereinafter, another example of the preferred embodiments of the present invention will be described. In the following description, components having substantially the same functions as those in the above-described first preferred embodiment are designated by the same reference characters, and the description thereof is omitted.

Second Preferred Embodiment

Figure 7:
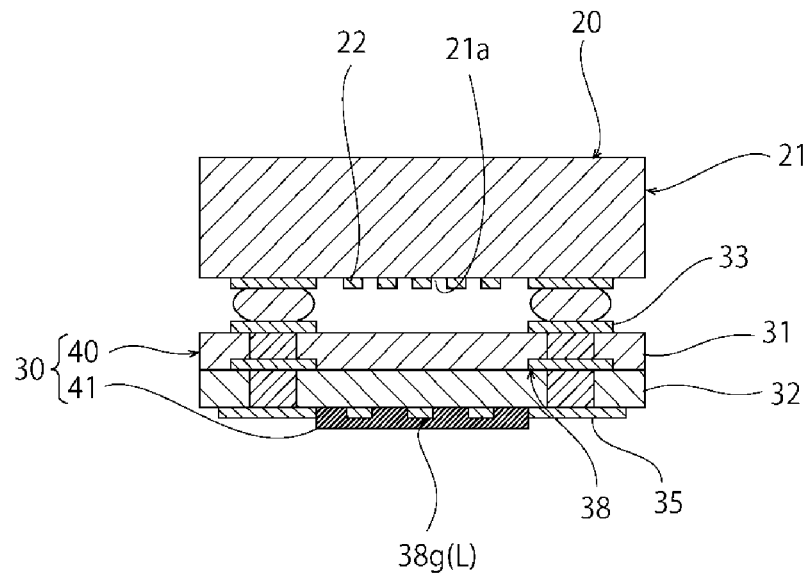
FIG. 7 is a schematic cross-sectional view of an elastic wave device according to a second preferred embodiment of the present invention.
Figure 8:
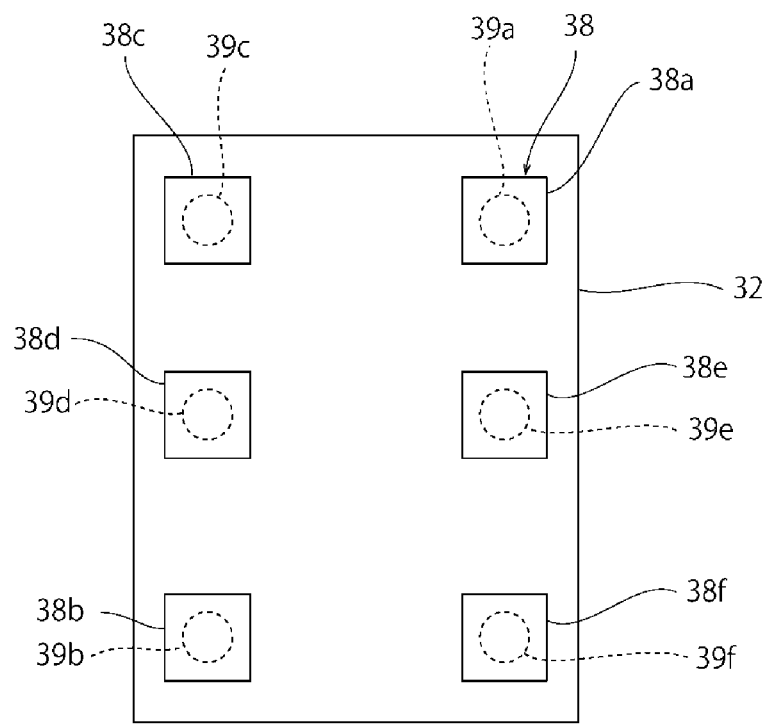
FIG. 8 is a schematic plan view of an intermediate electrode layer in the second preferred embodiment of the present invention.
Figure 9:
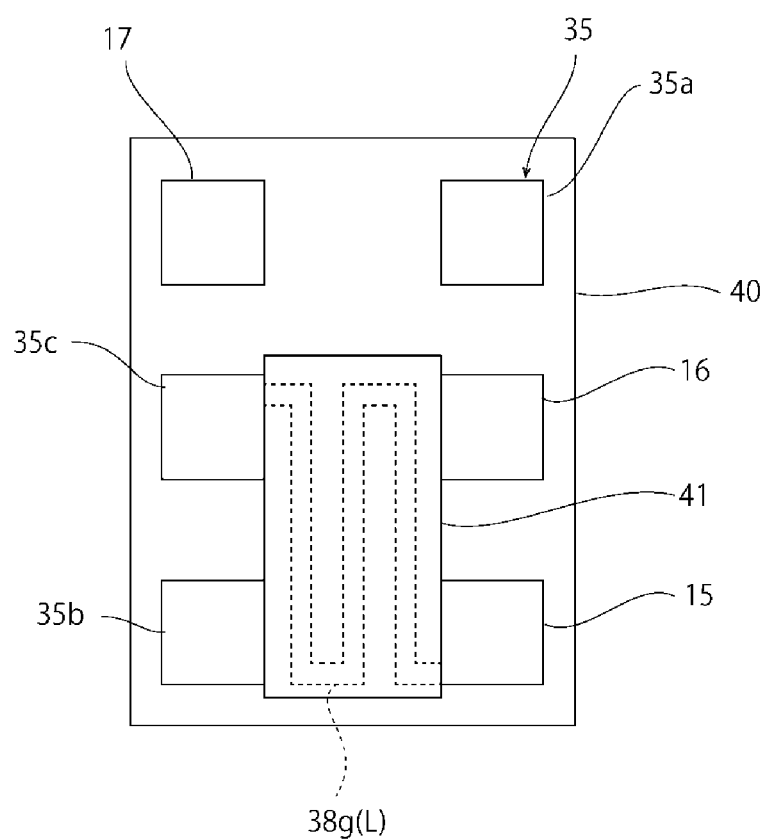
FIG. 9 is a schematic perspective back view of a mounting substrate in the second preferred embodiment of the present invention.

FIG. 7 is a schematic cross-sectional view of an elastic wave device according to a second preferred embodiment of the present invention. FIG. 8 is a schematic plan view of an intermediate electrode layer in the second preferred embodiment. FIG. 9 is a schematic perspective back view of a mounting substrate in the second preferred embodiment. It should be noted that in the second preferred embodiment, reference will be made to FIGS. 1, 3, and 4 in common with the first preferred embodiment.

In the elastic wave device 2 according to the present preferred embodiment, as shown in FIGS. 7 and 9, the mounting substrate 30 preferably includes a substrate main body 40 including first and second dielectric layers 31 and 32 and first to third electrode layers 33 to 35; and a resin layer 41 disposed on the substrate main body 40. The drawing electrode 38g defining the inductor L is included in the third electrode layer 35 located between the substrate main body 40 and the resin layer 41. In the elastic wave device 2 as well, it is possible to achieve an excellent heat radiation property similarly to the elastic wave device 1 according to the first preferred embodiment.

In manufacturing the elastic wave device 2, it is preferred to form the drawing electrode 38g after the elastic wave chip 20 is mounted on the mounting substrate 30.

For example, in the case where the drawing electrode is formed simultaneously with production of the substrate main body 40, the electrode is formed within a ceramic substrate or a resin substrate in many cases. In the case with a ceramic substrate, an inner layer wire is formed by patterning a wire material on a sheet material and then performing a firing process. In the firing process, the sheet material deforms, and thus there is a possibility that a wire is cut in a fine and complicated wiring pattern. In addition, in the case where a thick wiring layer is produced, waviness of a substrate occurs, and failure of mounting a component occurs. In the case with a resin substrate as well, waviness that occurs when the film thickness of an inner layer wire is made large is similar to that in the ceramic substrate. Therefore, it is difficult to form a drawing electrode with high shape accuracy. In contrast, in the case where the drawing electrode 38g is formed after the elastic wave chip 20 is mounted on the mounting substrate 30, there are less limitations on a method for forming the drawing electrode 38g. In addition, the substrate is less likely to deform, and thus various electrode forming methods such as application, plating, vapor deposition, sputtering, and the like are possible for electrode formation. Specifically, photolithography and plating may be used in combination, and thus it is possible to produce a wiring layer having a fine line width and a large thickness. Therefore, it is possible to form the drawing electrode 38g with high shape accuracy. Therefore, it is possible to form the inductor L having a high inductance value with the small drawing electrode 38g.

It should be noted that a sealing material may be provided on the mounting substrate 30 so as to seal the elastic wave chip 20. In this case, it is preferred to form the drawing electrode 38g after the sealing material is provided. This is because it is possible to eliminate influence of warpage or the like, which occurs in the mounting substrate 30 when the drawing electrode 38g is formed, on the sealing material formation.

It should be noted that in the first and second preferred embodiments, the case where the one end of the inductor preferably is connected to the dummy electrode has been described, but the one end of the inductor may be connected to a signal electrode. For example, the inductor may be provided in a series arm. For example, the inductor may be provided in a series arm and may define an LC resonant circuit.

In addition, the elastic wave device according to various preferred embodiments of the present invention may be an elastic wave device other than the ladder elastic wave filter device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a resonator;
   an inductor connected at one end thereof to the resonator and connected at another end thereof to a ground electrode or a signal electrode;
   a chip including a piezoelectric substrate and an interdigital transducer electrode provided on the piezoelectric substrate and defining the resonator;
   a dummy electrode to which the one end of the inductor is connected; and
   a mounting substrate on which the chip is mounted and to which the inductor is provided; wherein
   the chip is mounted on a front surface of the mounting substrate;
   the ground electrode or the signal electrode are provided on a back surface of the mounting substrate that is opposite to the front surface of the mounting substrate; and
   the dummy electrode is provided on the back surface of the mounting substrate.

2. The elastic wave device according to claim 1, wherein the inductor is defined by a drawing electrode, and the dummy electrode is connected to a wiring having a shorter length than that of the drawing electrode.

3. The elastic wave device according to claim 1, wherein the inductor is provided within the mounting substrate.

4. The elastic wave device according to claim 3, wherein
the inductor and the dummy electrode are connected to each other through a via hole electrode; and
the inductor and the ground electrode or the signal electrode are connected to each other through a another via hole electrode.

5. The elastic wave device according to claim 3, wherein
the mounting substrate includes a substrate main body and a resin layer provided on the substrate main body; and
the inductor is provided between the substrate main body and the resin layer.

6. The elastic wave device according to claim 1, wherein the resonator defines a parallel arm resonator of a ladder filter.

7. The elastic wave device according to claim 1, wherein the elastic wave device is one of an elastic wave filter, an elastic wave resonator and an elastic wave demultiplexer.

8. The elastic wave device according to claim 1, wherein the elastic wave device is one of a surface acoustic wave device, a boundary acoustic wave device, and a bulk acoustic wave device.

9. The elastic wave device according to claim 1, wherein the resonator includes a plurality of resonators.

10. The elastic wave device according to claim 1, further comprising a first signal terminal, a second signal terminal, wherein
the resonator includes a plurality of series arm resonators connected in series between the first signal terminal and the second signal terminal.

11. The elastic wave device according to claim 10, wherein the first signal terminal is an antenna terminal and the second signal terminal is an input signal terminal.

12. The elastic wave device according to claim 1, further comprising a plurality of parallel arms connected between a series arm and further ground electrodes and the resonator is located in one of the plurality of parallel arms.

13. The elastic wave device according to claim 1, wherein the mounting substrate includes a plurality of dielectric layers and a plurality of electrode layers.

14. The elastic wave device according to claim 13, further comprising a resin layer on the mounting substrate.

* * * * *